United States Patent
Basker et al.

(10) Patent No.: US 10,930,754 B2
(45) Date of Patent: *Feb. 23, 2021

(54) REPLACEMENT METAL GATE STRUCTURES

(71) Applicant: INTERNATIONAL BUSINESS MACHINES CORPORATION, Armonk, NY (US)

(72) Inventors: Veeraraghavan S. Basker, Schenectady, NY (US); Kangguo Cheng, Schenectady, NY (US); Theodorus E. Standaert, Clifton Park, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/587,340

(22) Filed: Sep. 30, 2019

(65) Prior Publication Data

US 2020/0027967 A1 Jan. 23, 2020

Related U.S. Application Data

(60) Continuation of application No. 16/266,709, filed on Feb. 4, 2019, which is a continuation of application
(Continued)

(51) Int. Cl.
*H01L 29/66* (2006.01)
*H01L 21/768* (2006.01)
(Continued)

(52) U.S. Cl.
CPC .. *H01L 29/66545* (2013.01); *H01L 21/31111* (2013.01); *H01L 21/76805* (2013.01);
(Continued)

(58) Field of Classification Search
None
See application file for complete search history.

(56) References Cited

U.S. PATENT DOCUMENTS 5,502,336 A 3/1996 Park et al.
6,331,478 B1 12/2001 Lee et al.
(Continued)

OTHER PUBLICATIONS

Notice of Allowance dated Aug. 27, 2019 in related U.S. Appl. No. 16/384,135, 7 pages.
(Continued)

*Primary Examiner* — Lex H Malsawma
(74) *Attorney, Agent, or Firm* — Steven Meyers; Andrew M. Calderon; Roberts Calderon Safran & Cole, P.C.

(57) ABSTRACT

Replacement metal gate structures with improved chamfered workfunction metal and self-aligned contact and methods of manufacture are provided. The method includes forming a replacement metal gate structure in a dielectric material. The replacement metal gate structure is formed with a lower spacer and an upper spacer above the lower spacer. The upper spacer having material is different than material of the lower spacer. The method further includes forming a self-aligned contact adjacent to the replacement metal gate structure by patterning an opening within the dielectric material and filling the opening with contact material. The upper spacer prevents shorting with the contact material.

16 Claims, 5 Drawing Sheets

Related U.S. Application Data

No. 15/986,335, filed on May 22, 2018, now Pat. No. 10,236,359, which is a continuation of application No. 15/784,366, filed on Oct. 16, 2017, now Pat. No. 10,056,489, which is a continuation of application No. 15/582,973, filed on May 1, 2017, now Pat. No. 9,865,739, which is a continuation of application No. 15/260,668, filed on Sep. 9, 2016, now Pat. No. 9,691,877, which is a division of application No. 14/667,085, filed on Mar. 24, 2015, now Pat. No. 9,685,532.

(51) Int. Cl.
| | | |
|---|---|---|
| *H01L 21/311* | (2006.01) | |
| *H01L 29/49* | (2006.01) | |
| *H01L 23/485* | (2006.01) | |
| *H01L 29/417* | (2006.01) | |
| *H01L 23/532* | (2006.01) | |
| *H01L 23/535* | (2006.01) | |
| *H01L 29/78* | (2006.01) | |
| *H01L 29/51* | (2006.01) | |

(52) U.S. Cl.
CPC ...... *H01L 21/76897* (2013.01); *H01L 23/485* (2013.01); *H01L 23/535* (2013.01); *H01L 23/53257* (2013.01); *H01L 29/41791* (2013.01); *H01L 29/4966* (2013.01); *H01L 29/6653* (2013.01); *H01L 29/6656* (2013.01); *H01L 29/7851* (2013.01); *H05K 999/99* (2013.01); *H01L 29/517* (2013.01); *H01L 29/785* (2013.01)

(56) References Cited

U.S. PATENT DOCUMENTS

| | | | |
|---|---|---|---|
| 6,342,450 B1 | 1/2002 | Lattard | |
| 6,426,247 B1 | 7/2002 | Divakaruni et al. | |
| 6,723,623 B1 | 4/2004 | Nguyen | |
| 6,878,613 B2 | 4/2005 | Stottko et al. | |
| 7,005,744 B2 | 2/2006 | Chen et al. | |
| 8,278,173 B2 | 10/2012 | Lim et al. | |
| 8,421,077 B2 | 4/2013 | Jain et al. | |
| 8,436,404 B2 | 5/2013 | Bohr et al. | |
| 8,536,040 B1 * | 9/2013 | Park | H01L 29/49 257/E21.198 |
| 8,575,727 B2 | 11/2013 | Lim et al. | |
| 9,093,467 B1 * | 7/2015 | Xie | H01L 29/66545 |
| 9,620,619 B2 | 4/2017 | Basker et al. | |
| 9,685,532 B2 | 6/2017 | Basker et al. | |
| 9,691,877 B2 * | 6/2017 | Basker | H01L 29/66545 |
| 9,865,739 B2 * | 1/2018 | Basker | H01L 29/66545 |
| 9,871,116 B2 | 1/2018 | Basker et al. | |
| 10,050,121 B2 | 8/2018 | Basker et al. | |
| 10,056,489 B2 | 8/2018 | Basker et al. | |
| 10,177,256 B2 | 1/2019 | Basker et al. | |
| 10,217,840 B2 | 2/2019 | Basker et al. | |
| 10,236,359 B2 | 3/2019 | Basker et al. | |
| 10,304,941 B2 | 5/2019 | Basker et al. | |
| 2001/0010961 A1 | 8/2001 | Jung et al. | |
| 2005/0277258 A1 | 12/2005 | Huang et al. | |
| 2006/0084275 A1 | 4/2006 | You et al. | |
| 2011/0156107 A1 | 6/2011 | Bohr et al. | |
| 2011/0210403 A1 | 9/2011 | Teo et al. | |
| 2012/0248508 A1 | 10/2012 | Ponoth et al. | |
| 2013/0026637 A1 | 1/2013 | Hou et al. | |
| 2013/0175635 A1 | 7/2013 | Kwon et al. | |
| 2014/0134836 A1 | 5/2014 | Pranatharthiharan et al. | |
| 2014/0217482 A1 | 8/2014 | Xie et al. | |
| 2014/0315361 A1 | 10/2014 | Niimi et al. | |
| 2015/0076623 A1 | 3/2015 | Tzou et al. | |
| 2015/0221749 A1 | 8/2015 | Xie et al. | |
| 2016/0163601 A1 | 6/2016 | Xie et al. | |
| 2016/0284817 A1 | 9/2016 | Basker et al. | |
| 2016/0380070 A1 | 12/2016 | Basker et al. | |
| 2017/0025315 A1 | 1/2017 | Ando et al. | |
| 2017/0236918 A1 | 8/2017 | Basker et al. | |
| 2017/0236938 A1 | 8/2017 | Basker et al. | |
| 2018/0047827 A1 | 2/2018 | Basker et al. | |
| 2018/0053854 A1 | 2/2018 | Basker et al. | |
| 2018/0061965 A1 | 3/2018 | Basker et al. | |
| 2018/0233581 A1 | 8/2018 | Basker et al. | |
| 2018/0269309 A1 | 9/2018 | Basker et al. | |
| 2018/0269326 A1 | 9/2018 | Basker et al. | |
| 2019/0140098 A1 | 5/2019 | Basker et al. | |
| 2019/0148554 A1 | 5/2019 | Basker et al. | |
| 2019/0181242 A1 | 6/2019 | Basker et al. | |
| 2019/0245059 A1 | 8/2019 | Basker et al. | |

OTHER PUBLICATIONS

List of IBM Patents or Patent Applications Treated as Related' 1 page.
Specification and Drawings for "Replacement Metal Gate Structures" for related U.S. Appl. No. 16/568,780, filed Sep. 12, 2019, 20 pages.
Notice of Allowance dated Oct. 23, 2019 in related U.S. Appl. No. 16/240,277, 18 pages.
Notice of Allowance dated Oct. 28, 2019 in related U.S. Appl. No. 16/245,861, 18 pages.
Notice of Allowance dated Oct. 31, 2019 in related U.S. Appl. No. 16/266,709, 18 pages.
Notice of Allowance dated Nov. 4, 2019 in related U.S. Appl. No. 16/384,135, 18 pages.
Office Action dated Oct. 31, 2019 in related U.S. Appl. No. 16/568,780, 8 pages.
Office Action dated Dec. 30, 2019 in related U.S. Appl. No. 16/668,496, 7 pages.
Notice of Allowance dated Feb. 20, 2020 in related U.S. Appl. No. 16/568,780, 7 pages.
Final Office Action dated Jun. 11, 2020 in related U.S. Appl. No. 16/668,496, 8 pages.
Office Action dated Sep. 30, 2020 in related U.S. Appl. No. 16/668,496, 10 pages.
Notice of Allowance dated Dec. 4, 2020 in related U.S. Appl. No. 16/668,496, 10 pages.

* cited by examiner

REPLACEMENT METAL GATE STRUCTURES

FIELD OF THE INVENTION

The invention relates to semiconductor structures and, more particularly, to replacement metal gate structures with improved chamfered workfunction metal and self-aligned contact and methods of manufacture.

BACKGROUND

Many challenges exist as semiconductor structures scale smaller and smaller. For example, complementary metal oxide semiconductors (CMOS) in the 7 nm node require small Lgate. Small Lgate, though, poses challenges in replacement high-k metal gate processes.

For example, with a gate length (Lg) less than 20 nm, a workfunction metal is deposited within a small opening formed by removal of a dummy gate structure. The deposition of the workfunction metal in such a small opening forms a seam due to a pinch-off effect. The deposition process is then followed by a recessing (chamfering) which removes workfunction metal in the upper portion of the gate before tungsten deposition, in order to improve gate resistance. However, it is very difficult to recess the workfunction metal without undesirably removing some of workfunction metal at a bottom of the seam and then etching the gate dielectric material and exposing the underlying fin structure, once the seam is open. Also, the formation of the self-aligned contact exposes the metal material of the replacement gate due to erosion of the sidewall spacer material, e.g., $SiO_2$, resulting in potential contact to gate shorting or other reliability issues.

SUMMARY

In an aspect of the invention, a method comprises forming a replacement metal gate structure in a dielectric material. The replacement metal gate structure is formed with a lower spacer and an upper spacer above the lower spacer. The upper spacer having material is different than material of the lower spacer. The method further comprises forming a self-aligned contact adjacent to the replacement metal gate structure by patterning an opening within the dielectric material and filling the opening with contact material. The upper spacer prevents shorting with the contact material.

In an aspect of the invention, a method comprises: forming a dummy gate structure with a first spacer of a first material; removing dummy gate material of the dummy gate structure to form an opening; forming gate dielectric material on the first spacer, within the opening; depositing workfunction material on the gate dielectric material; removing an upper portion of the first spacer to form a space between interlevel dielectric material and the gate dielectric material; laterally etching the workfunction material and the gate dielectric material from within the space to form a recessed portion with exposure of sidewalls of the interlevel dielectric material above the first spacer; depositing a second spacer on the exposed sidewalls of the interlevel dielectric material above the first spacer, the second spacer having material different than the first material; filling remaining portions of the recessed portion with metal gate material; forming a cap layer on the metal gate material; and forming a self-aligned contact adjacent to the metal gate material.

In an aspect of the invention, a replacement gate structure comprises: a lower spacer having a first material; an upper spacer above the lower spacer, the upper spacer being of a different material than the first material; a gate dielectric material lining the lower spacer and over a portion of a fin structure; a workfunction material on the gate dielectric material; a replacement gate material plugging an open seam of the workfunction material and above the workfunction material; a cap material on the replacement gate material, encapsulating an upper portion of the replacement gate material with upper spacer; and a self-aligned contact separated from the replacement gate structure by the upper spacer.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to replacement gate structures with improved chamfered workfunction metal and self-aligned contact and methods of manufacture. More specifically, in embodiments, the fabrication methods described herein simultaneously address workfunction metal chamfering (e.g., removal of an upper portion of the workfunction metal of the replacement metal gate during etch back processes) and low-k spacer erosion in self-aligned contact processes, which lead to contact to gate shorting and other reliability issues.

For example, the methods described herein eliminate undesirable removal of workfunction metal material at a bottom of a seam during etch back processes of a lower workfunction metal, thereby maintaining the designed Vt parameters of the workfunction metal. The methods described herein further prevent erosion of the underlying high-k dielectric during etch back processes of the lower workfunction metal. Moreover, due to materials and processes used for spacer deposition processes, contact-to-gate shorting that otherwise result during the conventional formation of a self-aligned contact process is eliminated.

The structures of the present invention can be manufactured in a number of ways using a number of different tools. In general, though, the methodologies and tools are used to form structures with dimensions in the micrometer and nanometer scale. The methodologies, i.e., technologies, employed to manufacture the structures of the present invention have been adopted from integrated circuit (IC) technology. For example, the structures of the present invention are built on wafers and are realized in films of material patterned by photolithographic processes on the top of a wafer. In particular, the fabrication of the structures of the present invention uses three basic building blocks: (i) deposition of thin films of material on a substrate, (ii) applying a patterned mask on top of the films by photolithographic imaging, and (iii) etching the films selectively to the mask.

Figure 1:
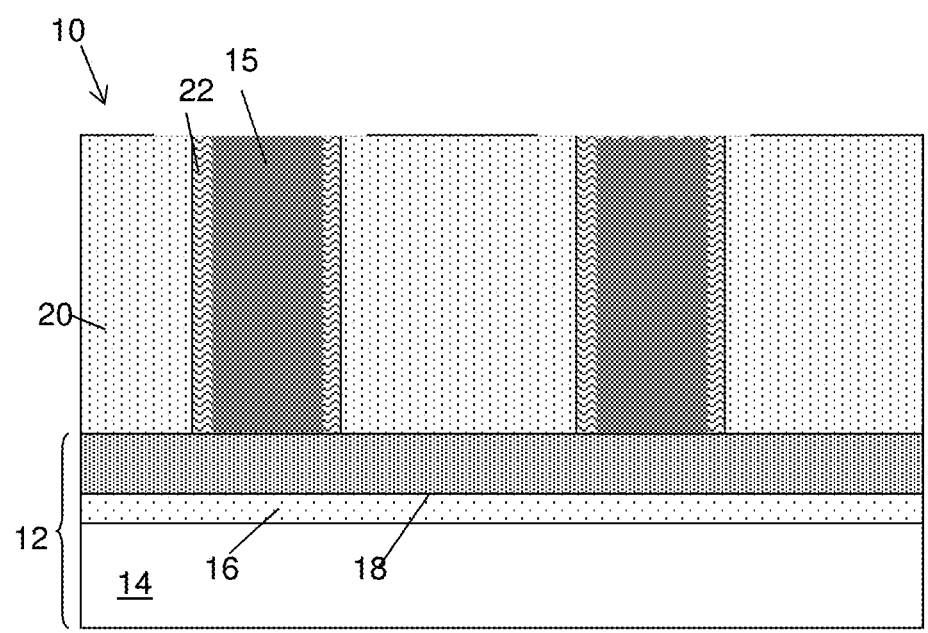
FIG. 1 shows a cross-sectional view of a structure and respective fabrication processes in accordance with aspects of the invention.

FIG. 1 shows a cross-sectional view of a structure and respective fabrication processes in accordance with aspects of the invention. The structure 10 includes a substrate 12. In embodiments, the substrate 12 can be a silicon-on-insulator (SOI) substrate or bulk wafer. By way of example, the substrate 12 includes a wafer 14, an insulator layer 16 and a semiconductor layer 18. The semiconductor layer 18 can be formed directly on the insulator layer 16, e.g., buried oxide layer (BOX). The semiconductor layer 18 can be any suitable semiconductor material including, but not limited to, Si, SiGe, SiGeC, SiC, GE alloys, GaAs, InAs, InP, and other III/V or II/VI compound semiconductors.

Still referring to FIG. 1, the semiconductor layer 18 is patterned into a plurality of fin structures of which a cross-sectional side view is shown at reference numeral 18. The fin structures 18 can be fabricated using conventional sidewall image transfer techniques. For example, in the SIT technique, a mandrel material, e.g., $SiO_2$, is deposited using conventional chemical vapor deposition (CVD) processes. A resist is formed on the mandrel material, and exposed to light to form a pattern (openings). A reactive ion etching (RIE) is performed through the openings to form the mandrels. Spacers are formed on the sidewalls of the mandrels which includes material different than the mandrels, and which are formed using conventional deposition processes known to those of skill in the art. The spacers can have a width which matches the dimensions of the fin structures 18, for example. The mandrels are removed or stripped using a conventional etching process, selective to the mandrel material. An etching is performed within the spacing of the spacers to form the sub-lithographic features, e.g., fin structures 18. The sidewall spacers can then be stripped.

FIG. 1 further shows a dummy gate process in accordance with aspects of the invention. In this process, a dummy gate material 15, e.g., polycrystalline silicon, is blanket deposited on the fin structures 18 using a conventional deposition process such as CVD. The dummy gate material 15 is then patterned using conventional photolithographic and etching processes. In embodiments, the dummy gate material 15 is patterned in an orthogonal direction with respect to the underlying fin structures 18. By way of example, a resist is formed over the dummy gate material 15, which is exposed to energy (e.g., light) to form a pattern (opening). A RIE process is performed through the openings of the resist to pattern the dummy gate material 15. The resist is removed using oxygen ashing processes or other conventional stripping processes.

Spacers 22 are formed on the sidewalls of the patterned dummy gate 15 using conventional sidewall deposition processes. In embodiments, the spacers 22 can be a low-k spacer. The low-k spacer refers to a material which has a k value less than that of SiN (k=7), for example, the low-k material could be SiBCN, SiOCN or SiON, etc. The spacers 22 can have a thickness of about 5 nm to 12 nm; although other dimensions are also contemplated by the present invention. Source and drain regions can be formed using conventional ion implantation or doping processes, as should already be understood by those of skill in the art such that no further explanation is required in order to understand the invention. An interlevel dielectric material 20 is deposited over the patterned dummy gate 15 and spacers 22. The interlevel dielectric material 20 can be planarized using a conventional chemical mechanical planarization (CMP) process. The CMP process will expose an upper surface of the patterned dummy gate 15 and spacers 22.

FIGS. 2-7 show replacement metal gate processes and respective structures in accordance with aspects of the invention. More specifically, in the processes of FIG. 2, the patterned dummy gate 15 can be removed using a selective etching process to the material of the patterned dummy gate 15. The removal process will result in an opening formed within the interlevel dielectric material 20, with the spacers 22 remaining on sidewalls thereof. In embodiments, the opening can be about 15 nm or less (e.g., 7 nm node target). A high-k gate dielectric material 24 is deposited within the opening, over the spacers 22. In embodiments, the high-k gate dielectric material 24 can be a hafnium based material, e.g., $HfO_2$, as an illustrative example. In embodiments, the high-k gate dielectric material 24 can be deposited to a depth of about 2 nm; although other dimensions are also contemplated by the present invention.

Figure 2:
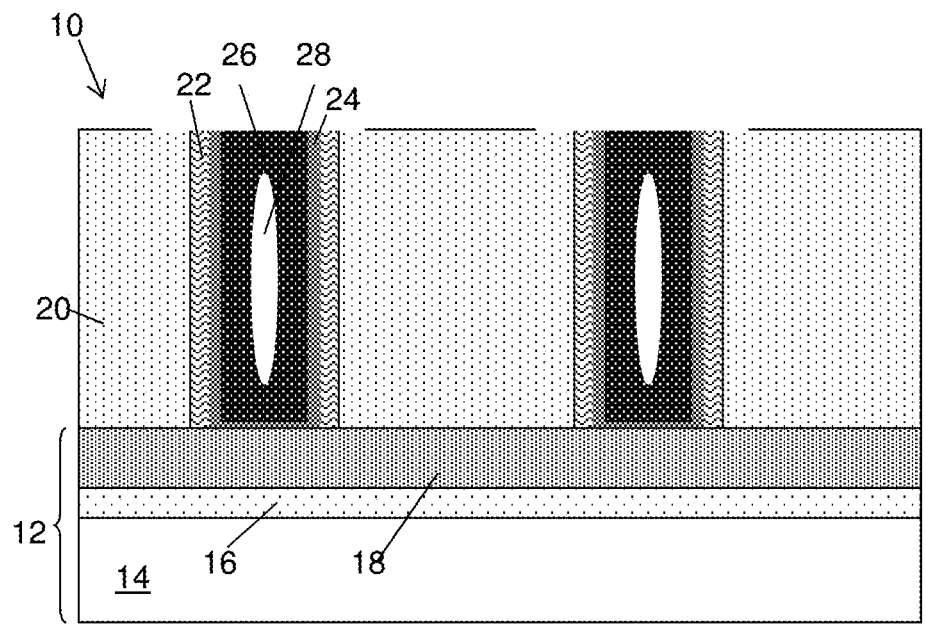
FIG. 2 shows one or more processes of removing a patterned dummy gate amongst other fabrication processes and respective structure in accordance with aspects of the invention.

Still referring to FIG. 2, a workfunction material (e.g., metal material) 26 is deposited within the remaining portion of the small opening, over the high-k dielectric material 24. In embodiments, the workfunction material 26 can be any metal material with a certain workfunction, depending on the design parameters of the transistor. The workfunction material 26 can be deposited using conventional deposition methods such as, for example, CVD or atomic layer deposition (ALD). Due to the small dimension of the opening, e.g., on the order of 9 nm or less, the deposition process of the workfunction material 26 will pinch-off, forming a seam 28.

Figure 3:
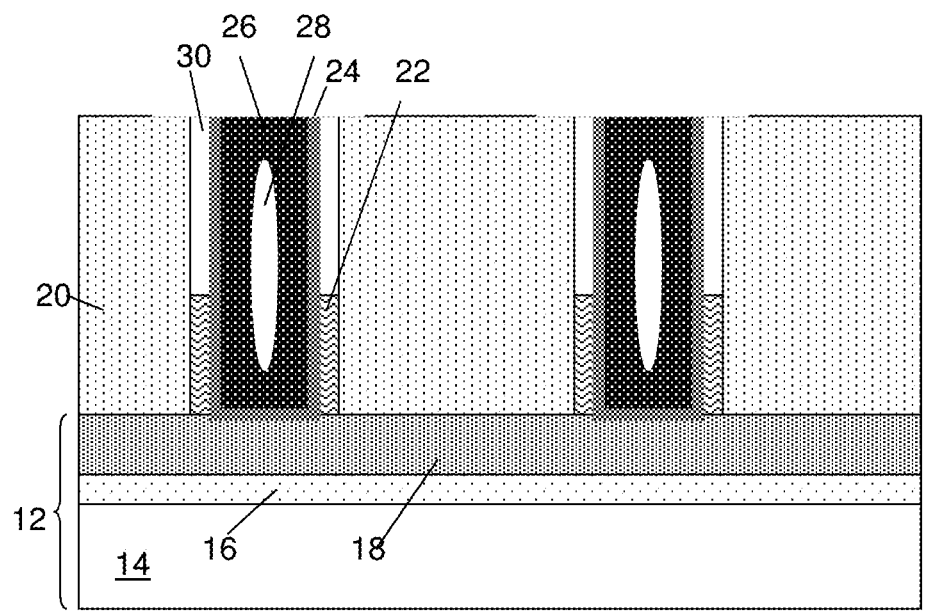
FIG. 3 shows one or more processes of forming a spacer material amongst other fabrication processes and a respective structure in accordance with aspects of the invention.

In FIG. 3, the spacer material 22 is selectively recessed or etched back to form openings 30 on sides of the workfunction material 26 and, more specifically, between the interlevel dielectric material 20 and the high-k dielectric material 24. For example, in embodiments, the recessing of the spacer material 22 can be performed by a selective etching process, which will not significantly affect or erode the interlevel dielectric material 20, the high-k dielectric material 24, or the workfunction metal 26. In embodiments, the spacer material 22 can be etched back to about 50% to 70% of the height of the workfunction metal 26 (e.g., height of the replacement gate structure). In more specific embodiments, the selective recessing or etch back process can remove about 30 nm to 50 nm of the spacer material 22. In even more specific embodiments, the spacer material 22 can be etched back to correspond to a level of the seam 28.

Figure 4:
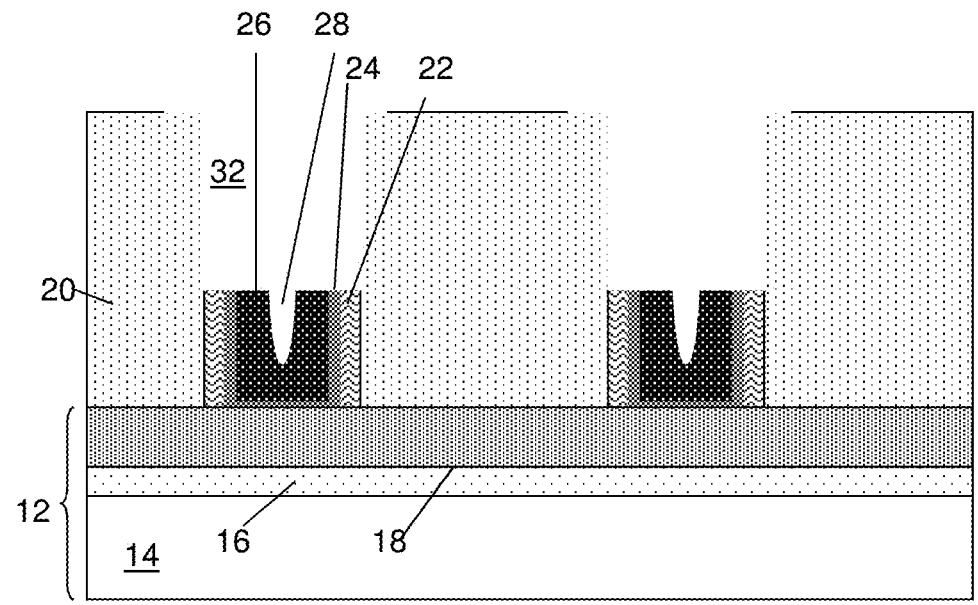
FIG. 4 shows one or more processes of removing upper portions material and respective structure in accordance with aspects of the invention.

In FIG. 4, upper portions of the high-k dielectric material 24 and workfunction material 26 can be removed by a lateral etching process, through the openings 30. In embodiments, the upper portions of the high-k dielectric material 24 and the workfunction material 26 can be removed by a wet etching process. In one example, the lateral etch of the workfunction material 26 has a target thickness slightly greater than the workfunction material 26. For example, a 6 nm etch will remove 5 nm thick workfunction material. As a lateral etching process is used to remove the upper portions of the high-k dielectric material 24 and the workfunction material 26, even when the seam 28 is open, an additional 1 nm overetch will not completely remove the workfunction material 26 down to the fin level (compared to the conventional top down workfunction metal recess). In other words, the lateral etch process will prevent the seam from being etched through, preventing exposure of the material of the fin structure 18 or erosion of the gate dielectric material 24.

Figure 5:
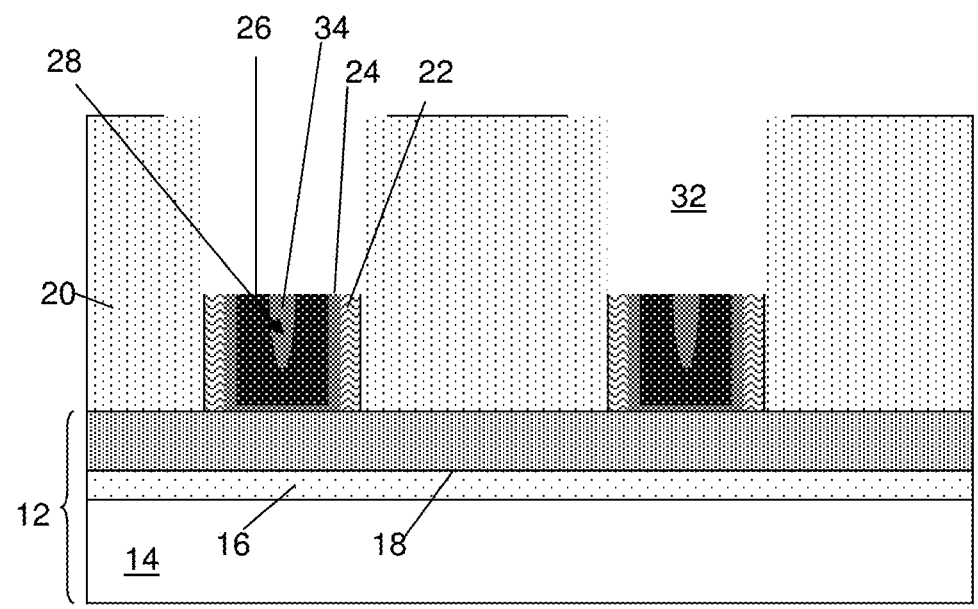
FIG. 5 shows one or more processes of filling a seam and respective structure in accordance with aspects of the invention.

As shown in FIG. 5, the remaining portions of the seam 28 can be filled (plugged) with a metal material 34. In embodiments, the metal material 34 can be tungsten or other metal material with a desired high resistivity. The metal material 34 can be deposited using a conventional blanket deposition fill process, e.g., CVD, followed by etch back processes.

Figure 6:
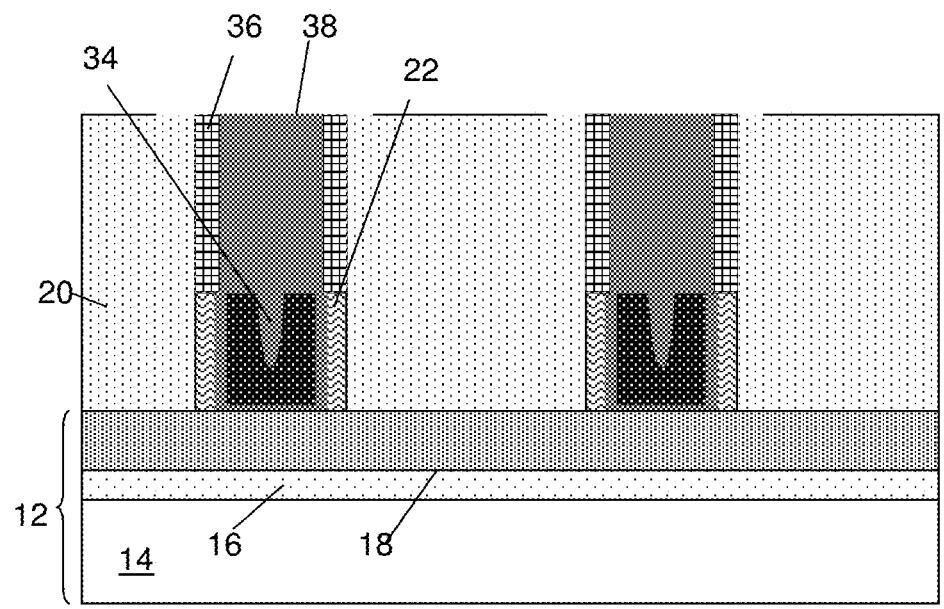
FIG. 6 shows one or more processes of forming a sidewall or spacer and respective structure in accordance with aspects of the invention.

In FIG. 6, a sidewall or spacer 36 is formed on exposed sidewalls of the interlevel dielectric material 20, directly above the spacers 22. In embodiments, the spacer 36 is a nitride material, e.g., SiN, which is more robust than the material of spacer 22, e.g., SiBCN or SiOCN, etc. More specifically, as should be understood by those of skill in the art, the nitride spacer 36 is more resistive to a later self-aligned contact RIE process than SiBCN or SiOCN, etc., thus acting as an etch stop to the underlying gate metal during the self-aligned contact RIE process. The spacer 36 can be deposited using any conventional sidewall deposition process. The remaining portions of the opening 32 are filled with a metal material 38. In embodiments, the metal material 38 will be the same as the metal material 34, e.g., tungsten. The metal material 38 can be deposited using a tungsten fill process, followed by a CMP process.

Figure 7:
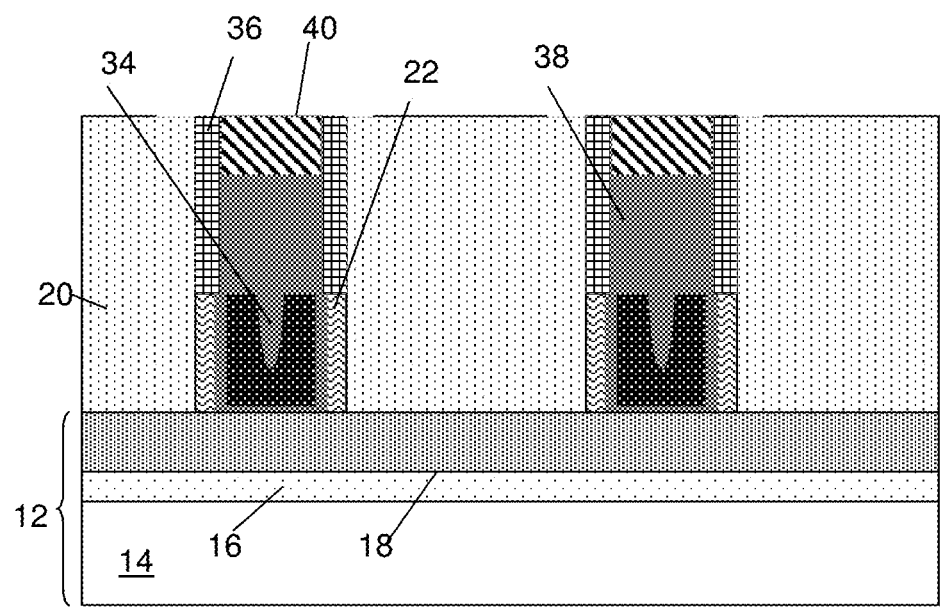
FIG. 7 shows one or more processes of recessing a material amongst other fabrication processes and a respective structure in accordance with aspects of the invention.

As shown in FIG. 7, the metal material 38 is recessed, followed by the formation of a self-aligned contact cap 40. By way of example, the metal material 38 can be recessed using a selective tungsten etching process, followed by a cap deposition process. The cap deposition process can be a nitride deposition process, which is provided by a blanket deposition process. The deposition process is followed by a CMP process to form the self-aligned contact cap 40. The spacer 36 and cap 40 will encapsulate an upper portion of the metal 38, protecting it during subsequent self-aligned contact RIE processes.

Figure 8:
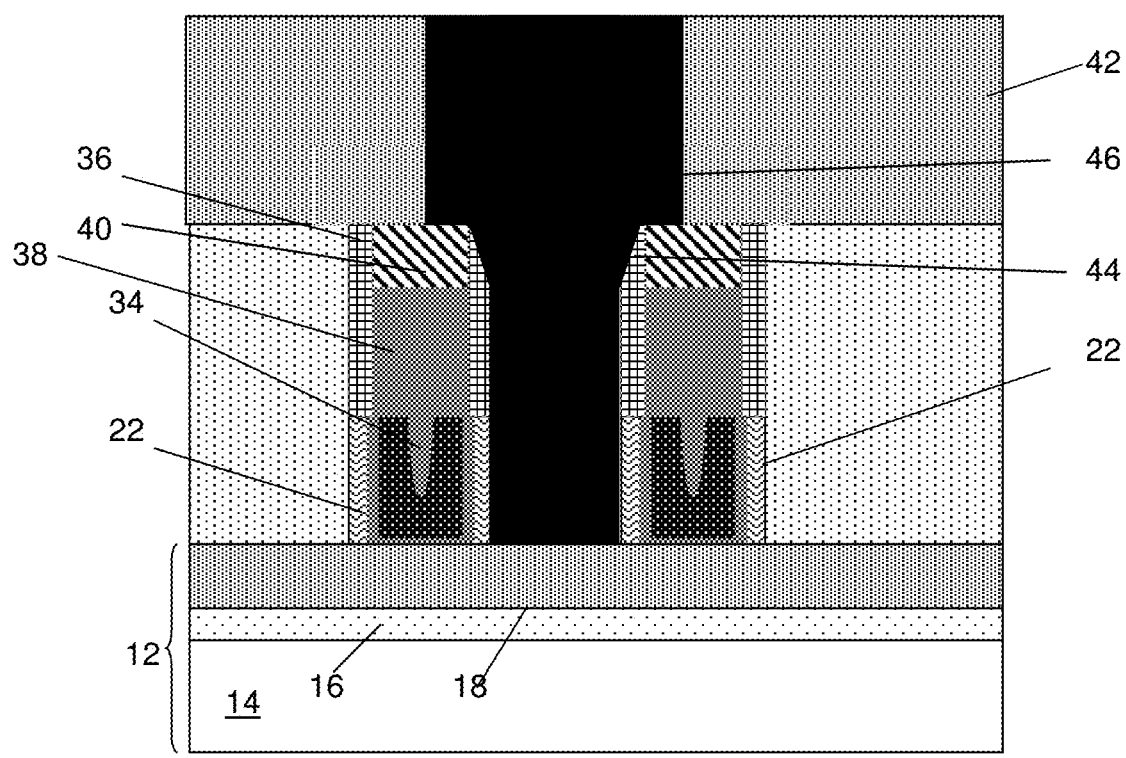
FIG. 8 shows one or more processes of forming a contact amongst other fabrication processes and a respective structure in accordance with aspects of the invention.

In FIG. 8, an oxide or other dielectric material 42 is deposited directly on the interlevel dielectric material 22 and self-aligned contact cap 40. The interlevel dielectric material 22 and dielectric material 42 are then patterned (e.g., etched) to form a self-aligned contact opening to the fin structure 18. In the etching process to form the self-aligned contact opening, the material of the spacer 36, e.g., nitride, will reduce spacer corner erosion. More specifically, although the etching process may result in a chamfer 44 of the spacer material, the spacer 36, e.g., nitride, will act as an etch stop over the underlying metal material 38 thereby preventing potential contact to gate shorts that would otherwise result from conventional replacement gate processes which use the less robust material of the spacer 22. That is, in conventional replacement gate processes, the less robust spacer material 22, e.g., SiBCN or SiOCN, etc., will etch away during the etching process to form the self-aligned contact opening, thus exposing the metal material 38 to the contact material, e.g., contact material 46. The self-aligned contact opening can then be filled with contact material 46, e.g., copper or other metal material.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A gate structure, comprising
a first set of spacers;
a second set of spacers over the first spacers;
a top surface of a gate dielectric material is below a bottom surface of the second set of spacers and is between the first set of spacers; and
a workfunction metal over the gate dielectric and having a seam below the second set of spacers,
wherein an upper surface of the first set of spacers is level with a top surface of the seam.

2. The gate structure of claim 1, wherein the gate dielectric material is in contact with the workfunction material.

3. The gate structure of claim 1, wherein the first set of spacers is lined by the gate dielectric material.

4. The gate structure of claim 1, wherein the first set of spacers is a first material and the second set of spacers is a different material than the first material.

5. The gate structure of claim 1, wherein the first material is SiBCN or SiOCN and the different material is SiN.

6. The gate structure of claim 5, wherein the SiN is more resistive to a self-aligned contact etching process than the SiBCN or the SiOCN.

7. The gate structure of claim 1, further comprising a plug within the seam.

8. The gate structure of claim 1, wherein the plug is a metal material, which is over the workfunction metal and below the second set of spacers.

9. The gate structure of claim 1, further comprising a self-aligned contact adjacent to the first set of spacers and the second set of spacers.

10. The gate structure of claim 9, wherein the first set of spacers and the second set of spacers are resistive to a self-aligned contact etching process.

11. The gate structure of claim 10, wherein the second set of spacers includes a chamfer.

12. The gate structure of claim 11, further comprising a contact cap over the workfunction metal.

13. The gate structure of claim 12, wherein the contact cap is directly over a top surface of a plug within the seam.

14. A gate structure, comprising
a first set of spacers;
a second set of spacers over the first spacers;
a top surface of a gate dielectric material is below a bottom surface of the second set of spacers and is between the first set of spacers; and
a workfunction metal over the gate dielectric and having a seam below the second set of spacers,
wherein the plug is a metal material, which is over the workfunction metal and below the second set of spacers, and
the second set of spacers is in direct contact with the metal material.

15. The gate structure of claim 14, wherein the workfunction material is completely below the second set of spacers.

16. A gate structure, comprising
a first set of spacers;
a second set of spacers over the first spacers;
a top surface of a gate dielectric material is below a bottom surface of the second set of spacers and is between the first set of spacers;
a workfunction metal over the gate dielectric and having a seam below the second set of spacers;
a self-aligned contact adjacent to the first set of spacers and the second set of spacers; and
a contact cap over the workfunction metal,
wherein the first set of spacers and the second set of spacers are resistive to a self-aligned contact etching process,
the second set of spacers includes a chamfer,
the contact cap is directly over a top surface of a plug within the seam, and
the contact cap is in direct contact with sidewalls of the second set of spacers.

* * * * *